United States Patent [19]
Kondo et al.

[11] Patent Number: 6,060,209
[45] Date of Patent: May 9, 2000

[54] PROCESS FOR MAKING LITHOGRAPHIC PRINTING PLATE AND PROCESSING SOLUTION TO BE USED IN THE SAME

[76] Inventors: Toshiro Kondo; Hajime Fujioka; Yoshihito Ohashi, all of c/o Mitsubishi Paper Mills Limited, 4-2, Marunouchi 3-chome, Chiyoda-ku, Tokyo, Japan

[21] Appl. No.: 09/198,524

[22] Filed: Nov. 24, 1998

[30] Foreign Application Priority Data

Nov. 25, 1997 [JP] Japan ................................. 9-322893
Dec. 18, 1997 [JP] Japan ................................. 9-348817

[51] Int. Cl.⁷ ............................ G03F 7/07; G03C 8/36; G03C 8/32
[52] U.S. Cl. .................... 430/204; 430/249; 430/248; 430/251
[58] Field of Search .................... 430/204, 248, 430/249, 251

[56] References Cited

U.S. PATENT DOCUMENTS

| | | | |
|---|---|---|---|
| 2,857,276 | 10/1958 | Land et al. ............................. | 430/251 |
| 4,297,430 | 10/1981 | Kanada et al. ......................... | 430/204 |
| 4,567,131 | 1/1986 | Watkiss ................................. | 430/204 |
| 5,273,858 | 12/1993 | Coppens et al. ....................... | 430/204 |
| 5,518,866 | 5/1996 | Coppens et al. ....................... | 430/204 |
| 5,853,950 | 12/1998 | Kondo et al. .......................... | 430/204 |
| 5,905,015 | 5/1999 | Linden et al. ......................... | 430/204 |
| 5,910,391 | 6/1999 | Kondo et al. .......................... | 430/204 |

*Primary Examiner*—Richard L. Schilling
*Attorney, Agent, or Firm*—Pillsbury Madison & Sutro

[57] ABSTRACT

There is disclosed a process for making a lithographic printing plate having physical development nuclei between an aluminum support and a silver halide emulsion layer to which, after exposure, a treatment using at least a developing solution, a washing solution and a finishing solution is applied in this order, the improvement wherein at least one of the above processing solutions contains at least one compound selected from the groups (A) and (B) mentioned below:

(A) at least one compound selected from the group consisting of an amine compound having a propyleneoxy group and an ethyleneoxy group, an aliphatic acid amide compound having a propyleneoxy group and an ethyleneoxy group, and a quaternary ammonium compound having a propyleneoxy group and an ethyleneoxy group; and (B) at least one compound selected from the group consisting of urea and a derivative thereof.

12 Claims, No Drawings

PROCESS FOR MAKING LITHOGRAPHIC PRINTING PLATE AND PROCESSING SOLUTION TO BE USED IN THE SAME

BACKGROUND OF THE INVENTION

This invention relates to a process for making a lithographic printing plate using an aluminum plate as a support and a processing solution to be used in the process, particularly to a process for making an aluminum lithographic printing plate using a silver complex salt diffusion transfer method and a processing solution to be used in the process.

Some examples of a lithographic printing plate using the silver complex diffusion transfer process (the DTR process) are described on pages 101 to 130 of André Rott and Edith Weyde, "Photographic Silver Halide Diffusion Processes", published by the Focal Press, London and New York (1972).

As described therein, there have been known two kinds of lithographic printing plates using the DTR process, i.e., a two sheet type in which a transfer material and an image-receiving material are separated and a mono-sheet type in which these materials are provided on one support. The two-sheet type lithographic printing plate is described in detail in Japanese Provisional Patent Publication No. 158844/1982. Also, the mono-sheet type one is described in detail in U.S. Pat. No. 3,728,114, Japanese Patent Publications No. 30562/1973 and No. 15765/1976, and Japanese Provisional Patent Publications No. 111103/1976 and No. 150105/1977.

The mono-sheet type lithographic printing plate utilizing the silver complex diffusion transfer process with the use of an aluminum plate as a support which is an object of the present invention (hereinafter referred to as "an aluminum lithographic printing plate") is described in detail in Japanese Provisional Patent Publication No. 118244/1982, No. 158844/1982, No. 26049:/1988, No. 116151/1991 and No. 282295/1992, and U.S. Pat. No. 4,567,131 and No. 5,427,889.

In the above-mentioned aluminum lithographic printing plate, physical development nuclei are carried on a roughened and anodized aluminum support and a silver halide emulsion layer is further provided thereon. A general process for making this lithographic printing plate comprises the steps of exposure, DTR development processing, water washing processing (washing off: removal of a silver halide emulsion layer with washing solution, hereinafter merely referred to as "washing processing") and finishing processing.

In detail, a metal silver image portion is formed on the physical development nuclei by the development processing and the silver halide emulsion layer is removed by the subsequent washing processing to expose the metal silver image portion (hereinafter referred to as "silver image portion"). Simultaneously, the anodized aluminum surface itself is exposed as a non-image portion.

On the exposed silver image portion and the non-image portion, a finishing solution containing a protective colloid such as gum arabic, dextrin, carboxymethyl cellulose, polystyrenesulfonic acid, etc. is coated for protecting the same. A processing of the so-called gum coating is applied to the surface of the plate. It is general that the finishing solution is called as a fixing solution and contains a compound which makes the silver image portion oleophilic (hereinafter referred to as "oleophilic agent").

As a problem in the process for making the above-mentioned aluminum lithographic printing plate, there is a problem of low ink receptivity at the silver image portion at initiation of printing. The ink receptivity is markedly lowered particularly by processing a large number of printing plates repeatedly for several days to several weeks which is so-called a running processing.

As a method for improving the ink receptivity, there is disclosed a finishing solution containing a protease and a hydrophobizing agent (an oleophilic agent) in U.S. Pat. No. 4,567,131, and a finishing solution containing a hydrophobizing agent (an oleophilic agent), a surfactant and a polyglycol in U.S. Pat. No. 5,518,866.

The ink receptivity is improved with a certain extent by the above-mentioned method, but lowering in ink receptivity in the running processing cannot sufficiently be improved.

SUMMARY OF THE INVENTION

An object of the present invention is to overcome the above problems and to provide a process for making an aluminum lithographic printing plate which can obtain high ink receptivity stably, particularly to provide a process for making the same in which ink receptivity is not lowered by a running processing.

The above-mentioned objects of the present invention can be accomplished by a process for making a lithographic printing plate by subjecting a lithographic printing material having physical development nuclei between an aluminum support and a silver halide emulsion layer to exposure and then processing the lithographic printing material at least with a developing solution, a washing solution and a finishing solution is applied in this order, the improvement wherein: at least one of the above processing solutions contains at least one compound selected from the groups (A) and (B) mentioned below:

(A) at least one compound selected from the group consisting of an amine compound having a propyleneoxy group and an ethyleneoxy group, an aliphatic acid amide compound having a propyleneoxy group and an ethyleneoxy group, and a quaternary ammonium compound having a propyleneoxy group and an ethyleneoxy group; and (B) at least one compound selected from the group consisting of urea and a derivative thereof.

A further preferred embodiment of the present invention comprises the following constitution.

(1) At least one of the above-mentioned processing solutions contains an oleophilic agent of a silver image.

(2) At least one of the above-mentioned washing solution and the finishing solution contains at least one compound selected from the group consisting of an amine compound having a propyleneoxy group and an ethyleneoxy group, an aliphatic acid amide compound having a propyleneoxy group and an ethyleneoxy group, and a quaternary ammonium compound having a propyleneoxy group and an ethyleneoxy group.

(3) At least one of the above-mentioned washing solution and the finishing solution contains urea or a derivative thereof.

(4) At least one of the above-mentioned washing solution and the finishing solution contains a polyoxyethylene sorbitan fatty acid ester or a polyoxyethylene sorbitol fatty acid ester.

(5) The above-mentioned finishing solution contains at least one compound selected from the group consisting of an amine compound having a propyleneoxy group and an ethyleneoxy group, an aliphatic acid amide compound having a propyleneoxy group and an ethyleneoxy group, and a quaternary ammonium compound having a propyleneoxy group and an ethyleneoxy group; and at least one of a polyoxyethylene sorbitan fatty acid ester and a polyoxyethylene sorbitol fatty acid ester.

DESCRIPTION OF THE PREFERRED EMBODIMENTS

The aluminum lithographic printing plate, which is an object of the present invention, is required to completely remove a silver halide emulsion layer by washing off using a washing solution to expose a silver image formed by a developing treatment to the surface. When removal of gelatin contained in the silver halide emulsion layer is insufficient, the remaining gelatin inhibits to make the silver image portion oleophilic whereby an ink receptivity is lowered. The washing off property of the aluminum lithographic printing plate by the use of the washing solution is extremely unstable and is subtly affected by preservation conditions of a lithographic printing plate material, the washing off conditions (such as temperature, composition of the washing solution, etc.), etc. As the results, the ink receptivity of the prepared plate of the lithographic printing plate is unstable. The washing off property becomes further unstable particularly by a running processing, and the ink receptivity is often markedly lowered. Also, an amount of the oleophilic agent in the processing solution is decreased by consumption thereof in the running processing, and this matter further promotes lowering in the ink receptivity.

The present inventors have earnestly studied about a process for processing a lithographic painting plate which can give a high ink receptivity stably even when the washing off property is unstable or when an amount of the oleophilic agent in the processing solution is decreased, and they have found that specific compounds having both of the ethyleneoxy group and the propyleneoxy group, or urea or a derivative thereof as mentioned above give extremely good results whereby accomplished the present invention.

In the following, the present invention will be described in detail.

The compounds to be used in the present invention are an amine compound having a group in which a propyleneoxy group (hereinafter referred to as "PO group") and an ethyleneoxy group (hereinafter referred to as "EO group") are block- or random-polymerized, a fatty acid amide compound having a group in which a PO group and an EO group are block- or random-polymerized, and a quaternary ammonium compound having a group in which a PO group and an EO group are block- or random-polymerized. A polymerization ratio of the PO group and the EO group is preferably 1:9 to 5:5 (in a molar ratio). The PO group and the EO group are each contained in one molecule in the range of 1 to 60 in number, preferably 2 to 40 in number.

Representative amine compounds having the PO group and the EO group are represented by the following formula (I):

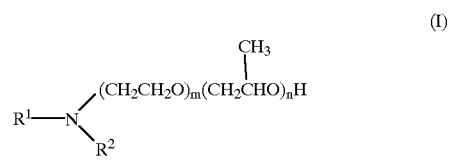

wherein $R^1$ and $R^2$ each represent an aliphatic group or a group in which the EO group and the PO group are polymerized; and m and n each represent a number of recurring unit of the EO group and the PO group, respectively.

As the aliphatic group, there may be mentioned an alkyl group, an alkenyl group, and an alkynyl group. These aliphatic groups may be substituted by an amino group, etc. Moreover, the amino group may be substituted by an aliphatic group or a group in which the EO group and the PO group are polymerized may be bonded to the amino group. One of $R^1$ and $R^2$ is preferably a group in which the EO group and the PO group are polymerized and the other is an aliphatic group having 4 to 18 carbon atoms. In the following, specific examples of the amine compound are enumerated.

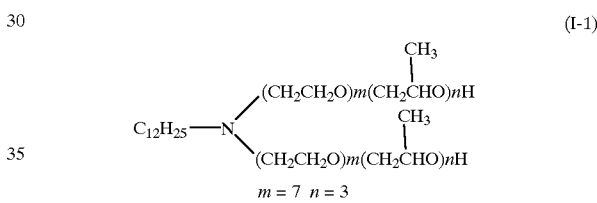

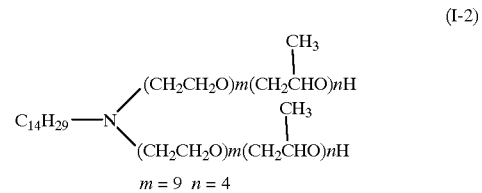

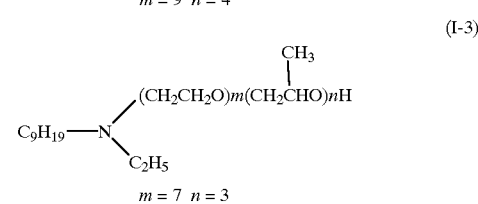

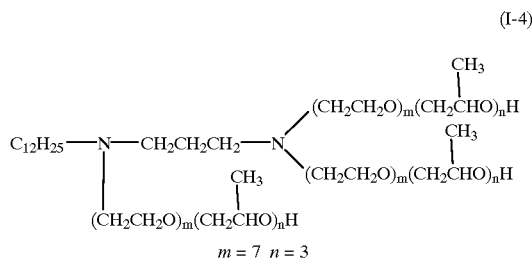

Next, a fatty acid amide compound having the PO group and the EO group is explained. Specific examples of said compound are represented by the following formula (II):

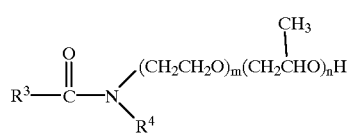

(II)

wherein $R^3$ represents an aliphatic group; $R^4$ represents an aliphatic group or a group in which the EO group and the PO group are polymerized; and m and n have the same meanings as defined above.

As the aliphatic group of $R^3$, there may be mentioned an alkyl group, an alkenyl group and an alkynyl group each having a carbon number of preferably 4 to 18. As the aliphatic group of $R^4$, there may be mentioned an alkyl group, an alkenyl group and an alkynyl group. $R^4$ is preferably the group in which the EO group and the PO group are polymerized. In the following, specific examples of the fatty acid amide compounds are enumerated.

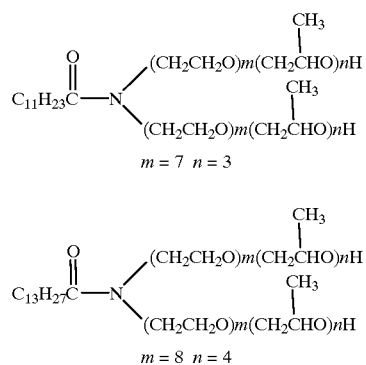

(II-1)

(II-2)

Next, the quaternary ammonium compound having the PO group and the EO group is explained. Representative examples of said compound are represented by the following formula (III):

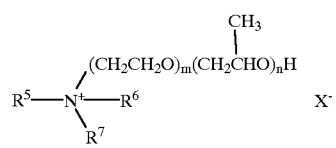

(III)

wherein $R^5$ has the same meaning as in $R^3$ defined above; $R^6$ and $R^7$ each have the same meanings as in $R^4$ defined above; $X^-$ represents an anion; and m and n have the same meanings as defined above.

Among the compounds represented by the above formula, preferred are compounds wherein $R^5$ is an aliphatic group having 4 to 18 carbon atoms; and $R^6$ and $R^7$ are both groups in which the EO group and the PO group are polymerized. $X^-$ represents an anion, and examples thereof may include a halogen anion such as $Cl^-$, $F^-$, $Br^-$, $I^-$, etc.; a mineral acid anion such as $SO_4^{2-}$, $NO_3^-$, etc. In the following, specific examples of the compounds are enumerated.

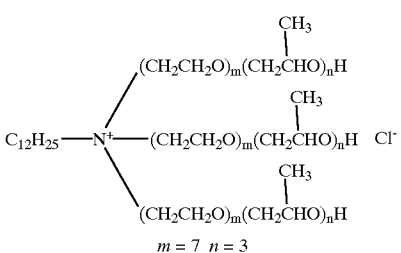

(III-1)

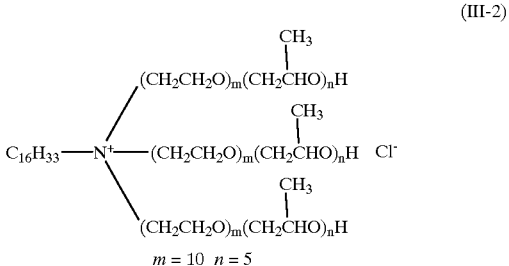

(III-2)

At least one of the above-mentioned compounds having the EO group and the PO group is contained in at least one of the processing solutions selected from the group consisting of a developing solution, a washing solution and a finishing solution. In the present invention, a stabilizing processing (neutralization after development) may be provided between the developing treatment and the washing treatment. In such a case, the above-mentioned compound(s) may be added to the stabilizing solution, which is within the scope of the present invention, and substantially the same effect as those of the present invention can be expected.

The above-mentioned compounds having the PO group and the EO group are preferably added to the washing solution and/or the finishing solution, particularly preferably to the finishing solution.

The above-mentioned compounds are added to the processing solution, in total, preferably in an amount of 1 to 100 g per liter, more preferably in the range of 2 to 20 g per liter.

In the present invention, ink receptivity can be improved by adding urea or a derivative thereof of at least one of the processing solutions. It can be considered that urea or a derivative thereof breaks hydrogen bonds of gelatin so that washing off property of a silver halide emulsion layer is improved stably. Urea or a derivative thereof is preferably added to the washing solution and/or the finishing solution, particularly preferably to the washing solution.

An amount of urea or a derivative thereof to be added to the processing solution is preferably in the range of 0.1 to 10 g per liter of the processing solution, more preferably in the range of 0.1 to 2 g/liter.

Urea or a derivative thereof to be used in the present invention is represented by the following formula (VI):

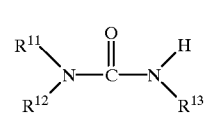

(VI)

wherein $R^{11}$, $R^{12}$ and $R^{13}$ each represent a hydrogen atom, an alkyl group, an aryl group, an amino group, a hydroxyl group or an amide group; and $R^{11}$ and $R^{12}$ or $R^{11}$ and $R^{13}$ may be combined to form a ring.

In the following, specific examples of urea or a derivative thereof are shown but the present invention is not limited by these.

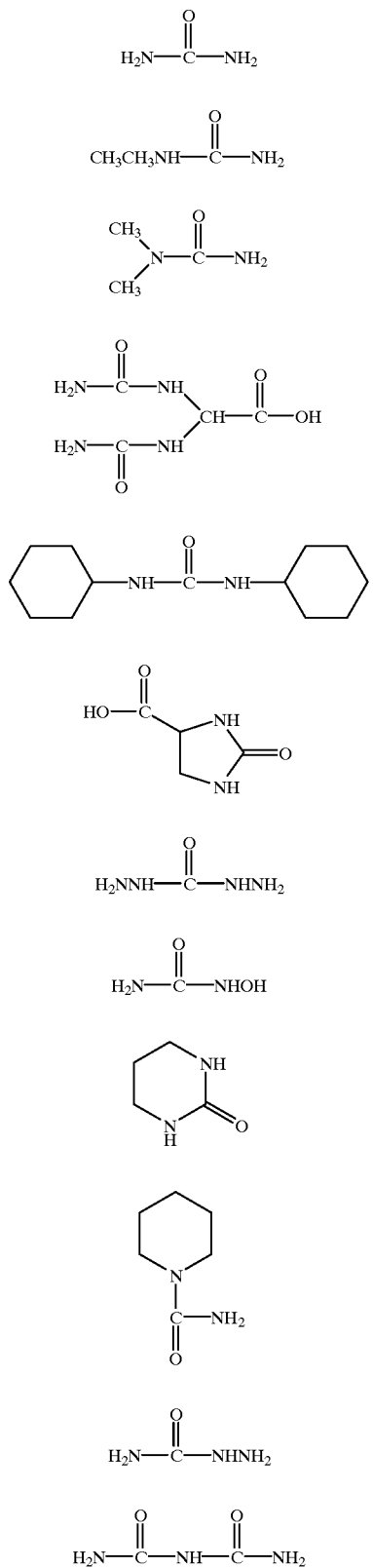

Among the above exemplary compounds, urea is particularly preferred.

It is preferred to further contain an oleophilic agent in the processing solution of the present invention, i.e., in the developing solution, the washing solution, the finishing solution, and in the stabilizing solution optionally used. As the oleophilic agent to be used in the present invention, there may be mentioned a compound having a mercapto group or a thione group, particularly preferably a nitrogen-containing heterocyclic compound having a mercapto group or a thione group, and they are described, for example, in Japanese Patent Publication No. 29723/1973 and Japanese Provisional Patent Publication No. 127928/1983.

Specific examples of the oleophilic agent to be used in the present invention are represented by the following formula (IV) or (V):

wherein $R^8$ and $R^{10}$ each represent an alkyl group having carbon atoms of 3 or more, preferably 3 to 12, an alkenyl group having carbon atoms of 3 or more, preferably 3 to 12, an aralkyl group or an aryl group; $R^9$ represents a hydrogen atom, an alkyl group, an alkenyl group, an aralkyl group or an aryl group; p and q each represent an integer of 1 or more, and when $R^9$ is an alkyl group having carbon atoms of 3 or more, an alkenyl group, an aralkyl group having carbon atoms of 3 or more or an aryl group, q may be 0; and Z represents a remaining atomic group necessary for forming a 5- or 6-membered ring with N and C in the formula.

As the specific examples of the 5- or 6-membered ring, there may be mentioned imidazole, imidazoline, thiazole, thiazoline, oxazole, oxazoline, pyrazoline, triazole, thiadiazole, oxadiazole, tetrazole, pyridine, pyrimidine, pyridazine, pyrazine, triazine, etc., or two or more these rings may be fused to form a fused ring, or may be fused with a benzene ring or a naphthalene ring. These rings preferably may not have a water-soluble group such as a carboxy group, a sulfo group, etc.

Specific examples of such a compound may include 2-mercapto-4-phenylimidazole, 2-mercapto-1-benzylimidazole, 2-mercapto-1-butyl-benzimidazole, 1,3-dibenzyl-imidazolidin-2-thione, 2-mercapto-4- phenylthiazole, 3-butyl-benzothiazolin-2-thione, 3-dodecyl-benzothiazolin-2-thione, 2-mercapto-4,5-diphenyloxazole, 3-pentyl-benzoxazolin-2-thione, 1-phenyl-3-methylpyrazolin-5-thione, 3-mercapto-4-allyl-5-pentadecyl-1,2,4-triazole, 3-mercapto-5-nonyl-1,2,4-triazole, 3-mercapto-4-acetamido-5-heptyl-1,2,4-triazole, 3-mercapto-4-amino-5-heptadecyl-1,2,4-triazole, 2-mercapto-5-phenyl-1,3,4-thiadiazole, 2-mercapto-5-n-heptyl-oxathiazole, 2-mercapto-5-n-heptyl-oxadiazole, 2-mercapto-5-phenyl-1,3,4-oxadiazole, 2-heptadecyl-5-phenyl-1,3,4-oxadiazole, 5-mercapto-1-phenyl-tetrazole, 3-mercapto-4-methyl-6-phenyl-pyridazine, 2-mercapto-5,6-diphenyl-pyrazine, 2-mercapto-4,6-diphenyl-1,3,5-triazine, 2-amino-4-mercapto-6-benzyl-1,3,5-triazine, etc., but the present invention is not limited by these examples.

An amount of the above-mentioned oleophilic agent to be added to the processing solution is suitably 0.01 to 10 g/liter. The above-mentioned oleophilic agent is preferably used in combination of two or more kinds thereof. Moreover, it is preferred to use the compound having the PO group and the EO group in combination with the above-mentioned oleophilic agent in a processing solution.

In the present invention, in the processing solutions after subjecting to developing processing, i.e., in the washing solution, the finishing solution, and the stabilizing solution (neutralizing solution after development) or an etching solution before printing which are provided depending on necessity, a water-soluble iodide may be preferably contained in at least one of these processing solutions. By adding the water-soluble iodide thereto, ink receptivity and press life can be markedly improved.

As the water-soluble iodide, there may be mentioned a water-soluble iodide such as lithium, potassium, sodium, ammonium, etc., but it may be an organic compound of iodides.

An amount of the water-soluble iodide to be added to the processing solution is preferably in the range of 0.001 to 0.2 mole per liter of the processing solution, more preferably 0.005 to 0.1 mole/liter.

In the present invention, it is further preferred to use the above-mentioned oleophilic agent in combination with the water-soluble iodide in one processing solution, particularly preferably in the processing solution subsequent to the development in combination. Accordingly, when the oleophilic agent and the water-soluble iodide are added to the washing solution, turbid of the washing solution can be prevented, recovery of silver can be realized, and simultaneously, ink receptivity and press life can be more improved.

In the process for preparing the lithographic printing plate according to the present invention, it is preferred to add a polyoxyethylene sorbitan fatty acid ester or a polyoxyethylene sorbitol fatty acid ester as a surfactant to the processing solutions (i.e., the developing solution, the washing solution, the finishing solution, or the stabilizing solution which may be used between the developing solution and the washing solution) to be used for preparing the plate. These surfactants, are preferably added to the washing solution and/or the finishing solution, particularly preferably in the finishing solution.

The above-mentioned polyoxyethylene sorbitan fatty acid ester or the polyoxyethylene sorbitol fatty acid ester is a group of nonionic surfactants prepared by esterification of a sorbitan or sorbitol to which an ethyleneoxy group is added and a higher fatty acid. The number of a recurring unit of the ethyleneoxy group is preferably 5 or more, more preferably 5 to 180 in total number. The fatty acid preferably used is a fatty acid having 10 or more carbon atoms such as lauric acid, palmitic acid, stearic acid, oleic acid, etc. The fatty acid ester can be a form of mono-, di-, tri- or tetra-ester. Specific examples of the polyoxyethylene sorbitan fatty acid ester may include Nikkol TP-10, Nikkol TS-10, Nikkol TS-30, Nikkol TO-10, Nikkol TO-30, etc. (all trade names, available from Nikko Chemical Co., Ltd.), Nonion LT-221, Nonion PT-221, Nonion ST-221, Nonion OT-221, etc. (all trade names, available from Nippon Oil & Fats Co.) Specific examples of the polyoxyethylene sorbitol fatty acid may include Nikkol GO-460, Nikkol GS-460 (all trade names, available from Nikko Chemical Co., Ltd.). Specific examples are enumerated below.

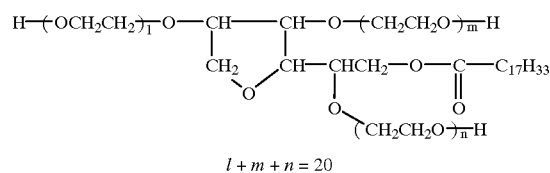

(S-1)

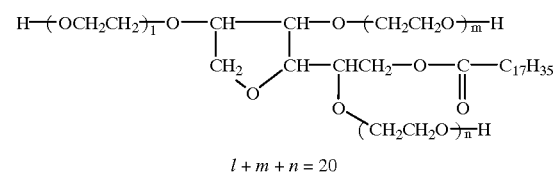

(S-2)

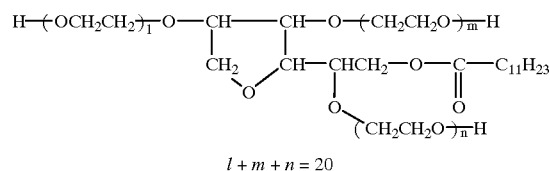

(S-3)

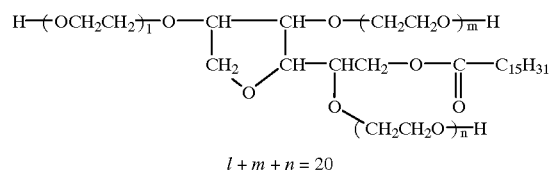

(S-4)

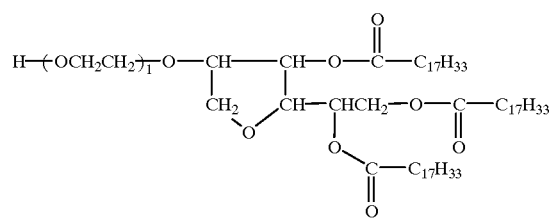

(S-5)

(S-6)

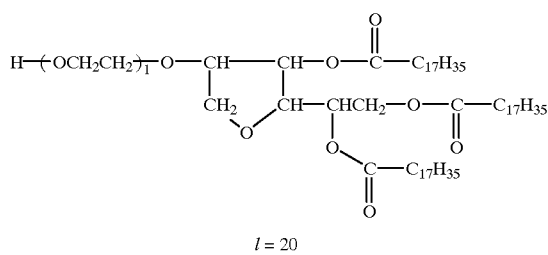

$l = 20$ (S-7)

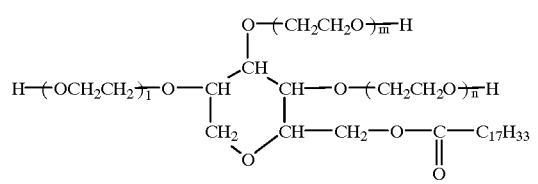

$l + m + n = 20$ (S-8)

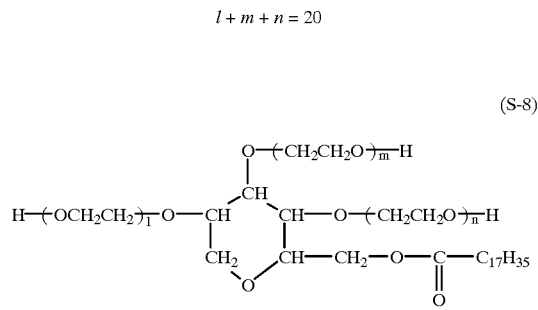

$l + m + n = 20$ (S-9)

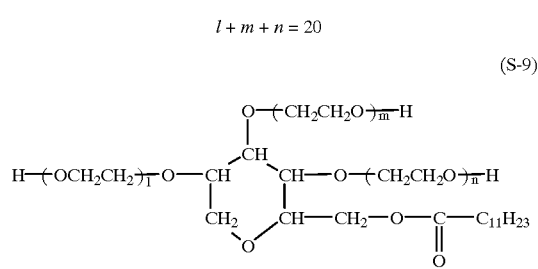

$l + m + n = 20$ (S-10)

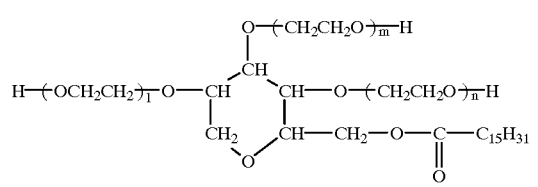

$l + m + n = 20$ (S-11)

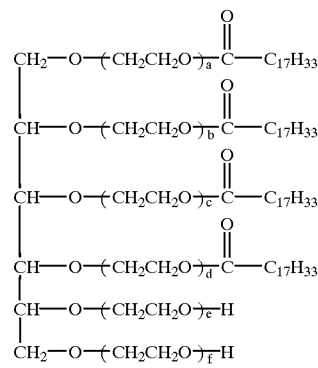

$a + b + c + d + e + f = 60$ (S-12)

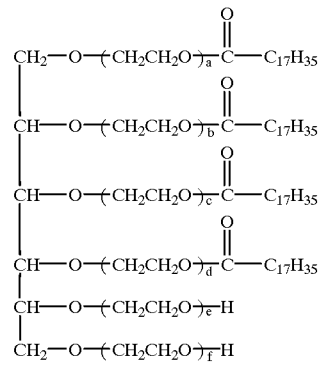

$a + b + c + d + e + f = 60$

In the above formulae, l, m, n, a, b, c, d, e and f each represent a number of recurring units of the EP group.

The above-mentioned surfactant is added to the processing solution preferably in the range of 0.1 to 30 g/liter, more preferably in the range of 0.5 to 20 g/liter. Said surfactant is preferably added to the washing solution and/or the finishing solution.

In the process for preparing a lithographic printing plate of the present invention, a proteinase may be added to the washing solution or the finishing solution. As the proteinase (hereinafter referred to as "the enzyme"), there may be used known vegetable or animal enzymes which can hydrolyze protein such as gelatin, etc. Examples of the enzyme may include pepsin, rennin, trypsin, chymotrypsin, cathepsin, papain, ficin, thrombin, renin, collagenase, bromelain and bacterioproteinase (e.g., Bioprase (trade name) produced by Nagase Sangyo Co., Ltd., Japan). Among them, trypsin, papain, ficin and bacterioproteinase are particularly preferred. An amount of the enzyme to be added to the processing solution is preferably about 0.5 to 50 g/liter.

The developing solution to be used in the present invention may contain additives including a developing agent such as a polyhydroxybenzene or a 3-pyrazolidinone; an alkaline substance such as potassium hydroxide, sodium hydroxide, lithium hydroxide, sodium tertiary phosphate or an amine compound; a preservative such as sodium sulfite; a viscosity modifier such as carboxymethyl cellulose; an antifoggant such as potassium bromide; a development modifier such as a polyoxyalkylene compound; a silver halide solvent such as a thiosulfate, a thiocyanate, a cyclic imide, thiosalicylic acid, a mesoionic compound, etc. A pH of the developing solution is generally 10 to 14, preferably 12 to 14.

The washing solution to be used in the present invention may contain a buffer for buffering the solution at a pH of 4 to 8, preferably in the range of 4.5 to 7 such as a phosphate buffer, a citrate buffer or a mixture of them. Also, a preservative may be added to the washing solution.

A stabilizing processing, which stops progress of development, may be applied between the developing processing and the washing processing. The above-mentioned compound having the PO group and the EO group or the oleophilic agent may be added to the stabilizing solution.

The washing solution is used for the purpose of completely removing a silver halide emulsion layer on an aluminum support. In general, a method of spraying a washing solution at 25 to 35 EOC according to the jet system or a method of peeling an emulsion layer by a scrub roller while spraying a washing solution is employed.

The silver image portion and the non-image portion exposed by the washing treatment is subjected to a treatment by the finishing solution for the purpose of heightening oleophilicity and hydrophilicity of the respective portions and for protecting the plate surface. In the present invention, the finishing solution may contain, in addition to the above-mentioned compound having the PO group and the EO group and the oleophilic agent, a protective colloid such as gum arabic, dextrin, sodium alginate, alginic acid propylene glyco- ester, hydroxyethyl starch, carboxymethyl cellulose, hydroxyethyl cellulose, polyvinyl pyrrolidone, polystyrene sulfonic acid, polyvinyl alcohol, etc. in order to protect and to improve hydrophilicity of the anodized layer at the non-image portion.

The lithographic printing plate which is the target of the present invention has physical development nuclei and the silver halide emulsion layer on the aluminum support. A silver halide emulsion is selected from the conventionally used silver chloride, silver bromide, silver iodide, silver chlorobromide, silver chloroiodobromide, silver iodobromide and so on, and an emulsion mainly comprising silver chloride (which means a silver halide emulsion comprising 50 mole % or more of silver chloride) is preferred. The type of the emulsion may be either negative type or positive type. The silver halide emulsion can be chemically sensitized or spectrally sensitized, if necessary.

The silver halide emulsion layer preferably contains the above-mentioned oleophilic agent. Gelatin is preferably used as a hydrophilic colloid of the silver halide emulsion layer when silver halide particles are prepared. As the gelatin, there may be used various gelatins such as acid-treated gelatin and alkali-treated gelatin. Also, modified gelatins thereof (e.g., phthalated gelatin and amidated gelatin) can be used. Further, a hydrophilic high molecular weight compound such as polyvinyl pyrrolione, various starches, albumin, polyvinyl alcohol, gum arabic and hydroxyethyl cellulose can be contained. As the hydrophilic colloid, a hydrophilic colloid substantially containing no hardener is desirably used in order to facilitate peeling of the silver halide emulsion layer after development.

The aluminum support to be used in the present invention is a roughened and anodized aluminum plate, and an aluminum support described in U.S. Pat. No. 5,427,889 is preferably used.

As the physical development nuclei in a physical development nuclei layer to be used in the present invention, known physical development nuclei used in the silver complex diffusion transfer process may be used. As an example thereof, there may be used a colloid of gold, silver or the like, a metal sulfide obtained by mixing a water-soluble salt of palladium, zinc and the like with a sulfide, and so on. As a protective colloid, various hydrophilic colloids may be used. With respect to details of the physical development nuclei and preparation process thereof, reference can be made to, for example, Andre Rott and Edith Weyde, "Photographic Silver Halide Diffusion Processes", published by the Focal Press, London and New York (1972).

In the present invention, a water-swelling intermediate layer as disclosed in U.S. Pat. No. 5,068,165 and No. 5,213,943 or an intermediate layer containing hydrophobic polymer beads as disclosed in U.S. Pat. No. 5,273,858 and No. 5,362,602 may be provided between the physical development nuclei layer and the silver halide emulsion layer. Also, a protective layer may be provided on the silver halide emulsion layer.

EXAMPLES

In the following, the present invention is explained by referring to Examples by which the present invention is not limited.

Example 1

According to the method as disclosed in U.S. Pat. No. 5,427,889 which is incorporated as a reference herein, electrolytic roughening treatment and anodization of an aluminum plate were carried out to obtain an aluminum support having a thickness of 0.30 mm to which pits with a diameter of 0.03 to 0.30 $\mu$m had been formed with about 5,600 per 100 $\mu$m$^2$ on a plateau with an average diameter of about 5 $\mu$m. and the pit has an average diameter of 0.08 $\mu$m. This aluminum support was subjected to anodization after the surface roughening treatment, and had an average roughness (Ra) measured by JIS B 0601 (1994) of 0.5 to 0.6 $\mu$m.

On the aluminum support, a physical development nuclei solution prepared by the Carey Lea method was coated and then dried. An amount of silver contained in a physical development nuclei layer was 3 mg/m$^2$.

As a silver halide emulsion, a silver chloroiodobromide emulsion (20 mole % of AgBr and 0.4 mole % of AgI) having an average particle size of 0.2 $\mu$m, with which 0.006 mmole of potassium hexachloroiridate (IV) per mole of silver was doped, was prepared by the control double jet method. As a protective colloid, alkali-treated gelatin was used. Further, the emulsion was then subjected to sulfur-gold sensitization, and then spectrally sensitized by using 3 mg of a sensitizing dye represented by the following formula (A) per 1 g of silver.

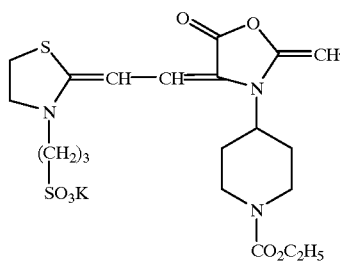

(A)

A surfactant was added to the thus prepared silver halide emulsion, and the mixture was coated on the aluminum support on which the above-mentioned physical development nuclei had been coated, so that an amount of silver became 2 g/m$^2$ (a gelatin amount of 3 g/m$^2$), followed by drying to obtain a lithographic printing material.

On the thus prepared lithographic printing material, an image was outputted by an output machine having a red LD laser at 633 nm as a light source. Then, the lithographic printing material was processed by a processor for plate making (a SLT-N automatic developing machine (trade name) manufactured by Du Pont Co.) to obtain a lithographic printing plate. The processor for plate making is constituted by a step of development processing (dipping at 21° C. for 30 seconds), a step of washing processing (peeing an emulsion layer by a scrub roller while showering and jetting a washing solution at 32° C. for 10 seconds), a step of finishing processing (showering at 21° C. for 5 seconds) and a drying step. The development processing step was carried out by developing the lithographic printing material dipping in 30 liters of a developing solution stored in a developing tank. The washing processing step employs a mechanism in which 30 liters of a washing solution stored in a storing tank were circulating with a pump, jet showering on the lithographic printing material, and recovering in the storing tank. The finishing processing step employs the same constitution as those of the washing processing step except for storing 10 liters of a finishing solution in a storing tank. During the running processing, the developing solution was supplemented by a liquid surface, but the washing solution and the finishing solution were not supplemented. Under the above conditions, 100 m$^2$ of the lithographic printing material was treated.

A developing solution, a washing solution and a finishing solution used in the processing are shown below.

| Developing solution A | |
|---|---|
| Sodium hydroxide | 20 g |
| Hydroquinone | 20 g |
| 1-Phenyl-3-pyrazolidinone | 2 g |
| Anhydrous sodium sulfite | 80 g |
| Monomethylethanolamine | 6 g |
| 2-Mercapto-5-n-heptyl-oxadiazole | 0.5 g |
| Anhydrous sodium thiosulfate | 6 g |
| Ethylenediamine tetraacetate sodium salt | 5 g |
| Polyethylene glycol (Average molecular weight: 400) | 10 g |
| Make up to 1,000 ml with deionized water. | |
| A pH was adjusted to 13.0. | |

<Washing solution A>

| 2-Mercapto-5-n-heptyl-oxadiazole | 0.5 g |
|---|---|
| Monoethanolamine | 5 g |
| Potassium primary phosphate | 20 g |
| Sodium sulfite | 10 g |
| Make up to 1,000 ml with deionized water. | |
| A pH was adjusted to 6.0. | |

<Finishing solution A>

| Gum arabic | 10 g |
|---|---|
| 2-Mercapto-5-n-heptyl-oxadiazole | 0.5 g |
| Potassium primary phosphate | 10 g |
| Make up to 1,000 ml with deionized water. | |
| A pH was adjusted to 6.0. | |

<Finishing solution B>
10 g of proteinase (trypsin) was added to the above Finishing solution A.

<Finishing solution C>
75 g of polyethylene glycol having a molecular weight of 3000 was added to the above Finishing solution A.

<Finishing solution D>
10 g of a compound represented by the following formula (B) was added to the above Finishing solution A.

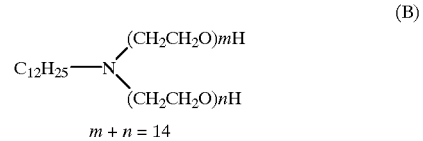

(B)

$m + n = 14$

<Finishing solution E>
10 g of a compound represented by the following formula (C) was added to the above Finishing solution A.

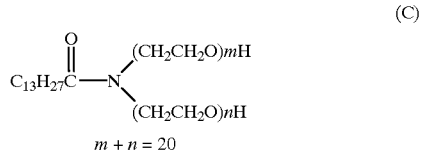

(C)

$m + n = 20$

<Finishing solution F>
10 g of the compound represented by the formula (I-1) was added to the above Finishing solution A.

<Finishing solution G>
10 g of the compound represented by the formula (II-1) was added to the above Finishing solution A.

<Finishing solution H>
10 g of the compound represented by the formula (III-1) was added to the above Finishing solution A.

With respect to the first plates and the plates after processing in amounts of 100 m$^2$ of the lithographic printing plates prepared by the process described above, printing was carried out by using a printer Ryobi 3200CD (trade name, an offset printing press manufactured by Ryobi K.K.), an ink (New Champion Black H, trade name, produced by Dainippon Ink Co., Japan) and commercially available damping water for a PS plate, and ink receptivity (inking) at the time of staring printing was evaluated. The ink receptivity was evaluated by the number of sheets printed until the density of images become stable after starting printing. The results are shown in Table 1.

TABLE 1

| Test No. | Finishing solution | Ink receptivity | | Remarks |
|---|---|---|---|---|
| | | First plate | After treating 100 m² | |
| 1 | A | 18 sheets | 45 sheets | Comparative |
| 2 | B | 12 sheets | 35 sheets | Comparative |
| 3 | C | 15 sheets | 40 sheets | Comparative |
| 4 | D | 14 sheets | 37 sheets | Comparative |
| 5 | E | 14 sheets | 39 sheets | Comparative |
| 6 | F | 6 sheets | 8 sheets | Present invention |
| 7 | G | 9 sheets | 13 sheets | Present invention |
| 8 | H | 10 sheets | 15 sheets | Present invention |

Example 2

In the same manner as in Example 1, experiments were carried out except for using the following washing solutions, the developing solution A and the finishing solution A used in Example 1. The results are shown in Table 2.

<Washing solution A>

| 2-Mercapto-5-n-heptyl-oxadiazole | 0.5 g |
|---|---|
| Monoethanolamine | 5 g |
| Potassium primary phosphate | 20 g |
| Sodium sulfite | 10 g |
| Make up to 1,000 ml with deionized water. | |
| A pH was adjusted to 6.0. | |

<Washing solution B>
10 g of proteinase (trypsin) was added to the above solution A.
<Washing solution C>
75 g polyethylene glycol having a molecular weight of 3000 was added to the above Washing solution A.
<Washing solution D>
10 g of a compound represented by the above formula (B) was added to the above Washing solution A.
<Washing solution E>
10 g of a compound represented by the above formula (C) was added to the above Washing solution A.
<Washing solution F>
10 g of the compound represented by the formula (I-1) was added to the above Washing solution A.
<Washing solution G>
10 g of the compound represented by the formula (II-1) was added to the above Washing solution A.
<Washing solution H>
10 g of the compound represented by the formula (III-1) was added to the above Washing solution A.

TABLE 2

| Test No. | Washing solution | Ink receptivity | | Remarks |
|---|---|---|---|---|
| | | First plate | After treating 100 m² | |
| 9 | A | 21 sheets | 49 sheets | Comparative |
| 10 | B | 15 sheets | 38 sheets | Comparative |
| 11 | C | 17 sheets | 45 sheets | Comparative |
| 12 | D | 18 sheets | 40 sheets | Comparative |
| 13 | E | 18 sheets | 41 sheets | Comparative |

TABLE 2-continued

| Test No. | Washing solution | Ink receptivity | | Remarks |
|---|---|---|---|---|
| | | First plate | After treating 100 m² | |
| 14 | F | 9 sheets | 11 sheets | Present invention |
| 15 | G | 11 sheets | 14 sheets | Present invention |
| 16 | H | 13 sheets | 16 sheets | Present invention |

As clearly seen from the results shown in Examples 1 and 2, the process for preparing a lithographic printing plate of the present invention in which a compound having a PO group and an EO group in the washing solution or the finishing solution can improve ink receptivity as compared with the conventional plate preparing process. Particularly in the running processing, whereas the ink receptivity was markedly lowered in the comparative samples, substantially no lowering was observed in the present samples and high ink receptivity was maintained.

Example 3

On an aluminum support prepared in accordance with Example 1, a physical development nuclei solution containing palladium sulfide as physical development nuclei was coated, followed by drying. An amount of nuclei contained in the physical development nuclei layer was 3 mg/m².

As a silver halide emulsion, a silver chloroiodobromide emulsion (20 mole % of AgBr and 0.4 mole % of AgI) having an average particle size of 0.2 μm, with which 0.006 mmole of potassium hexachloroiridate (IV) per mole of silver was doped, was prepared by the control double jet method and by using alkali-treated gelatin as a protective colloid. Further, the emulsion was subjected to sulfur-gold sensitization, and then spectrally sensitized by using 3 mg of a sensitizing dye represented by the above formula (A) per 1 g of silver.

A surfactant was added to the thus prepared silver halide emulsion, and the mixture was coated or the aluminum support on which the above-mentioned physical development nuclei had been coated, so that an amount of silver became 2 g/m² (a gelatin amount of 3 g/m²), followed by drying to obtain a lithographic printing material.

In the same manner as in Example 1 mentioned above, an image was outputted to the above lithographic printing material and the material was subjected to plate making treatment to prepare a lithographic printing plate.

A developing solution, washing solutions and finishing solutions used in the treatments are shown below.

(Developing solution B)

| Sodium hydroxide | 20 g |
|---|---|
| Hydroquinone | 20 g |
| 1-Phenyl-3-pyrazolidinone | 2 g |
| Anhydrous sodium sulfite | 80 g |
| Monomethylethanolamine | 6 g |
| 2-Mercapto-5-n-heptyl-oxadiazole | 0.4 g |
| Anhydrous sodium thiosulfate | 6 g |
| Ethylenediamine tetraacetate sodium salt | 5 g |
| Polyethylene glycol | 10 g |
| (Average molecular weight: 400) | |
| Make up to 1,000 ml with deionized water. | |
| A pH was adjusted to 13.0. | |

<Washing solution I>

| 2-Mercapto-5-n-heptyl-oxadiazole | 0.5 g |
|---|---|
| Monoethanolamine | 5 g |
| Potassium primary phosphate | 20 g |
| Sodium sulfite | 10 g |
| Make up to 1,000 ml with deionized water. | |
| A pH was adjusted to 6.0. | |

<Washing solution J>

0.5 g of urea (formula (VI-1)) was added to the above Washing solution I.

amounts of 100 m² of the lithographic printing plates prepared by the process described above, printing was carried out by using a printer Heidelberg TOK (trade name, an offset printing press manufactured by Heidelberg Co.), an ink (New Champion Black H, trade name, produced by Dainippon Ink Co., Japan) and commercially available damping water for a PS plate, and ink receptivity (inking) at the time of staring printing was evaluated. The ink receptivity was evaluated by the number of sheets printed until the density of images become stable after starting printing. The results are shown in Table 3.

TABLE 3

| | | | Ink receptivity | | | |
|---|---|---|---|---|---|---|
| Test No. | Washing solution | Finishing solution | First plate | After treating 50 m² | After treating 100 m² | Remarks |
| 17 | I | I | 23 sheets | 33 sheets | 55 sheets | Comparative |
| 18 | I | J | 18 sheets | 25 sheets | 45 sheets | Comparative |
| 19 | J | I | 14 sheets | 19 sheets | 22 sheets | Present invention |
| 20 | K | I | 16 sheets | 21 sheets | 28 sheets | Present invention |
| 21 | L | I | 16 sheets | 21 sheets | 28 sheets | Present invention |
| 22 | J | K | 9 sheets | 11 sheets | 12 sheets | Present invention |
| 23 | J | L | 11 sheets | 15 sheets | 18 sheets | Present invention |
| 24 | J | M | 12 sheets | 16 sheets | 19 sheets | Present invention |
| 25 | J | N | 6 sheets | 8 sheets | 10 sheets | Present invention |

<Washing solution K>

0.5 g of urea (formula (VI-2)) was added to the above Washing solution I.

<Washing solution L>

0.5 g of urea (formula (VI-7)) was added to the above Washing solution I.

<Finishing solution I>

| Gum arabic | 10 g |
|---|---|
| 2-Mercapto-5-n-heptyl-oxadiazole | 0.4 g |
| Potassium primary phosphate | 10 g |
| Make up to 1,000 ml with deionized water. | |
| A pH was adjusted to 6.0. | |

<Finishing solution J>

10 g of proteinase (trypsin) was added to the above Finishing solution I.

<Finishing solution K>

10 g of the compound represented by the formula (I-1) was added to the above Finishing solution.

<Finishing solution L>

10 g of the compound represented by the formula (II-1) was added to the above Finishing solution I.

<Finishing solution M>

10 g of the compound represented by the formula (III-1) was added to the above Finishing solution I.

<Finishing solution N>

10 g of the compound represented by the formula (I-1) and 1 g of the compound represented by the formula (S-1) were added to the above Finishing solution I.

With respect to the first plates, the plates after processing in amounts of 50 m² and the plates after processing in As can be clearly seen from the above results, ink receptivity was improved by adding urea to the washing solution. Particularly in the running processing, whereas the ink receptivity was markedly lowered in the comparative samples, substantially no lowering was observed in the present samples and high ink receptivity was maintained. By adding a compound having the EO group and the PO group to the finishing solution, ink receptivity was further improved. Also, by using an amine compound having the PO group and the EO group in combination with a polyoxyethylene sorbitan fatty acid ester or a polyoxyethylene sorbitol fatty acid ester in the finishing solution, excellent synergistic effect can be obtained.

What is claimed is:

1. A process for making a lithographic printing plate comprising the steps of:

subjecting a lithographic printing material having physical development nuclei between an aluminum support and a silver halide emulsion layer to exposure and then processing the lithographic printing material at least with processing solutions of a developing solution, a washing solution and a finishing solution, applied in this order, wherein at least one of said processing solutions contains a compound of the group (A) recited below or at least one of the washing solution and the finishing solution contains a compound of the group (B) recited below:

(A) at least one compound selected from the group consisting of an amine compound having a propyleneoxy group and an ethyleneoxy group, an aliphatic acid amide compound having a propyleneoxy group and an ethyleneoxy group, and a quaternary ammonium compound having a propyleneoxy group and an ethyleneoxy group; and (B) at least one compound selected from the group consisting of urea and a derivative thereof.

2. The process according to claim 1, wherein at least one of the above-mentioned processing solutions contains an oleophilic agent of a silver image.

3. The process according to claim 1, wherein at least one of the washing solution and the finishing solution contains at least one compound selected from the group consisting of an amine compound having a propyleneoxy group and an ethyleneoxy group, an aliphatic acid amide compound having a propyleneoxy group and an ethyleneoxy group, and a quaternary ammonium compound having a propyleneoxy group and an ethyleneoxy group.

4. The process according to claim 2, wherein the oleophilic agent is a compound represented by the formula (IV) or (V):

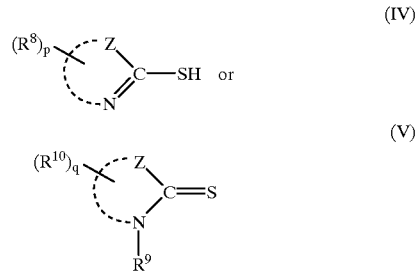

wherein $R^8$ and $R^{10}$ each represent an alkyl group having carbon atoms of 3 or more, an alkenyl group having carbon atoms of 3 or more, an aralkyl group or an aryl group; $R^9$ represents a hydrogen atom, an alkyl group having carbon atoms of 3 or more, an alkenyl group having carbon atoms of 3 or more, an aralkyl group or an aryl group; p and q each represent an integer of 1 or more, and when $R^9$ is an alkyl group having carbon atoms of 3 or more, an alkenyl group having carbon atoms of 3 or more, an aralkyl group or an aryl group, q may be 0; and Z represents a remaining atomic group necessary for foaming a 5- or 6-membered ring with N and C in the formula.

5. The process according to claim 3, wherein at least one of the washing solution and the finishing solution contains a polyoxyethylene sorbitan fatty acid ester or a polyoxyethylene sorbitol fatty acid ester.

6. The process according to claim 1, wherein at least one of the washing solution and the finishing solution contains a polyoxyethylene sorbitan fatty acid ester or a polyoxyethylene sorbitol fatty acid ester.

7. The process according to claim 1, wherein the finishing solution contains at least one compound selected from the group consisting of an amine compound having a propyleneoxy group and an ethyleneoxy group, an aliphatic acid amide compound having a propyleneoxy group and an ethyleneoxy group, and a quaternary ammonium compound having a propyleneoxy group and an ethyleneoxy group; and at least one of a polyoxyethylene sorbitan fatty acid ester and a polyoxyethylene sorbitol fatty acid ester.

8. The process according to claim 1, wherein an oleophilic agent of a silver image is contained in at least two processing solutions.

9. The process according to claim 1, wherein the amine compound having the propyleneoxy group and the ethyleneoxy group is a compound represented by the formula (I):

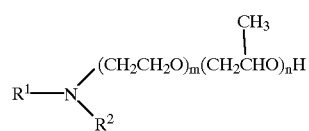

wherein $R^1$ and $R^2$ each represent an aliphatic group or a group in which the ethyleneoxy group and the propyleneoxy group are polymerized; and m and n each represent a number of the recurring unit of the ethyleneoxy group and the propyleneoxy group, respectively.

10. The process according to claim 1, wherein the aliphatic acid amide compound having the propyleneoxy group and the ethyleneoxy group is a compound represented by the formula (II):

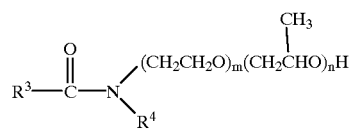

wherein $R^3$ represents an aliphatic group; $R^4$ represents an aliphatic group or a group in which the ethyleneoxy group and the propyleneoxy group are polymerized; and m and n each represent a number of the recurring unit of the ethyleneoxy group and the propyleneoxy group, respectively.

11. The process according to claim 1, wherein the quaternary ammonium compound having the propyleneoxy group and the ethyleneoxy group is a compound represented by the formula (III):

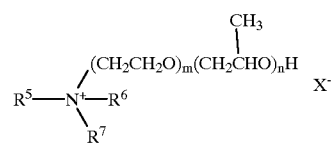

wherein $R^5$ represents an aliphatic group; $R^6$ and $R^7$ each represent an aliphatic group or a group in which the ethyleneoxy group and the propyleneoxy group are polymerized; $X^-$ represents an anion; and m and n each represent a number of the recurring unit of the ethyleneoxy group and the propyleneoxy group, respectively.

12. The process according to claim 1, wherein urea or the derivative thereof is a compound represented by the formula (VI):

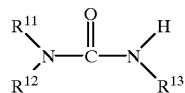

wherein $R^{11}$, $R^{12}$ and $R^{13}$ each represent a hydrogen atom, an alkyl group, an aryl group, an amino group, a hydroxyl group or an amide group; and $R^{11}$ and $R^{12}$ or $R^{11}$ and $R^{13}$ may be combined to form a ring.

* * * * *